United States Patent [19]
Butler

[11] Patent Number: 5,420,540
[45] Date of Patent: May 30, 1995

[54] DOUBLE-FOLDED CASCODE OPERATIONAL AMPLIFIER

[75] Inventor: James R. Butler, San Jose, Calif.

[73] Assignee: Analog Devices, Inc., Norwood, Mass.

[21] Appl. No.: 285,066

[22] Filed: Aug. 3, 1994

[51] Int. Cl.⁶ .............................................. H03F 3/45
[52] U.S. Cl. ..................................... 330/255; 330/311
[58] Field of Search ................ 330/252, 255, 257, 311

[56] References Cited

U.S. PATENT DOCUMENTS

| | | | |
|---|---|---|---|
| 4,463,319 | 7/1984 | Kearney | 330/258 |
| 4,687,984 | 8/1987 | Butler | 323/315 |
| 4,918,398 | 4/1990 | Huijsing et al. | 330/252 |
| 5,140,280 | 8/1992 | Vyne et al. | 330/255 |
| 5,293,136 | 3/1994 | Ryat | 330/255 X |
| 5,294,892 | 3/1994 | Ryat | 330/255 X |

OTHER PUBLICATIONS

Goodenough, "Circuit Lets IC OP AMP Handle ±0-.9-V Rail-To-Rail Signals:", *Electronic Design*, Oct. 1, 1992, p. 31.

Vyne et al., "A Quad Low Voltage Rail-To-Rail Operational Amplifier", *IEEE 1992 Bipolar Circuits and Technology Meeting*, pp. 242–245.

*Primary Examiner*—James B. Mullins
*Attorney, Agent, or Firm*—Koppel & Jacobs

[57] ABSTRACT

A double-folded cascode operational amplifier capable of operating with rail-to-rail common mode inputs includes two differential input transistor pairs of opposite conductivity, with an associated current source and input resistor pair for each pair of input transistors. Its gain stage includes two interconnected pairs of folded cascode gain transistors that are connected to the two pairs of input resistors so that a change in the differential input signal produces a corresponding change in the gain stage output via the resistors. An output stage includes transistor-resistor circuitry to bias a pair of output transistors in opposite directions and produce a net amplifier output at their junction.

8 Claims, 2 Drawing Sheets

DOUBLE-FOLDED CASCODE OPERATIONAL AMPLIFIER

BACKGROUND OF THE INVENTION

1. Field of the Invention

This invention relates to operational amplifiers (op amps) and more particularly to double-folded cascode op amps.

2. Description of the Related Art

Folded-cascode operational amplifiers have an improved common mode rejection ratio (CMRR) and common mode voltage range (CMVR) compared to more conventional operational amplifiers. A folded-cascode design is described in U.S. Pat. No. 4,687,984 by the present inventor, "JFET Active Load Input Stage". The described circuit is also less likely to go into saturation or cut-off states during high slew rates.

A basic design for the input and gain stages of a folded-cascode operational amplifier is shown in FIG. 1. A pair of differentially connected transistors Q1 and Q2, which can be either bipolar or junction field effect transistors (JFETs), have their current circuits connected together on one side to divide the output of a current source Is. As used herein, a transistor's "current circuit" refers to the collector-emitter circuit of a bipolar transistor, or the source-drain circuit of an FET; a transistor's "control circuit" refers to the base of a bipolar device, or the gate of an FET.

Input terminals T1 and T2, connected respectively to the control circuits for Q1 and Q2, receive a differential input signal. Q1 and Q2 divide the current from Is in mutual opposition, with the amount of current for each transistor varying in accordance with the relative input voltage signals applied to their control circuits from the input terminals T1, T2.

The input current source Is operates from a positive voltage supply bus Vcc, while the collectors of the illustrative pnp input transistors Q1 and Q2 are connected to a relatively negative voltage supply bus (generally ground potential) through respective input resistors R1 and R2.

A gain stage for the amplifier includes first and second active load npn bipolar gain transistors Q3 and Q4, whose emitters are connected to the collectors of input transistors Q1 and Q2, respectively. The bases of Q3 and Q4 are connected together for common biasing. The transistors Q3 and Q4 are supplied with current from current sources I1 and I2, which can be implemented for example by pnp bipolar transistors. A bias circuit for Q3 and Q4 consists of (1) another npn bipolar transistor Q5 that has its emitter connected to the bases of Q3 and Q4, its base connected to the collector of Q3 and its collector connected to Vcc, and (2) a current source I3 that draws current from the common base junction of Q3/Q4 to the ground bus. A gain stage output 2 is taken from the collector of the gain transistor Q4.

The operation of this prior circuit can be explained by assuming that the input voltage at terminal T2 goes up in relation to the voltage at T1. This causes the current through Q1 to increase and the current through Q2 to drop. The increased current through Q1 produces a larger voltage drop across R1, and thus a higher voltage at the bases of Q3 and Q4 (through the emitter follower action of Q3). The higher voltage at the base of Q4 causes the current through that transistor to also go up. In addition, the reduced current through the second input transistor Q2 tends to reduce the voltage across R2. To counteract this effect and keep the voltage across R2 equal to that across R1 (because of the emitter follower action of Q3 and Q4), the current through Q4 increases. The net effect is that, to the first order, there is an increase in current through Q4 equal to twice the absolute magnitude of the current change through either Q1 or Q2. Since current source I2 supplies a constant current level to the gain stage output, any change in the current through Q4 is reflected as an equal absolute change in the output current 2. During this time the base-emitter connection of Q5 across the collector-base terminals of Q3 holds the current level through Q3 constant (to the first order) at the I1 level.

The circuit of FIG. 1 has a limited common mode input range that extends from the low voltage supply line (typically ground) to two base-emitter voltage drops (about 1.4 volts) below Vcc. This was satisfactory for past applications in which positive and negative 15 volt supplies ("rails") were typical. However, amplifiers are presently being designed to work with +5 volt and ground rails, and even +3 volt and ground rails. A primary reason for the steady reduction in power supply levels is the need for lower power dissipation in battery powered electronic devices, such as lap-top computers and cellular telephones. The reduction of over 1 volt from a full rail-to-rail common mode input range is a significant and undesirable loss with these low voltage circuits.

A double-folded cascode operational amplifier has been developed that provides a rail-to-rail input capability. One pair of transistors in the gain stage handles inputs down to the lower rail or below, while another pair of gain stage transistors accommodates input signals up to the upper rail or above. See Goodenough, "Circuit Lets IC OP AMP Handle ±0.9-V Rail-To-Rail Signals", *Electronic Design*, Oct. 1, 1992, page 31; Vyne et al., "A Quad Low Voltage Rail-to-Rail Operational amplifier", IEEE 1992 *Bipolar circuits and Technology Meeting*, pages 242–245. While this circuit has a greater operating range than more conventional folded cascode op amps, the circuitry is quite complex and requires a relatively large number of transistors, which occupy an undesirably large total area and add to the circuit's cost.

SUMMARY OF THE INVENTION

The present invention seeks to provide an op amp with a rail-to-rail input range, but with an efficient circuit design that occupies a relatively small area and requires relatively few transistors.

These goals are achieved with a double-folded cascode op amp with an input stage that includes first and second differential transistor pairs of opposite conductivity that are supplied with respective differential currents. Two pairs of input resistors are connected between the transistors' current circuits and opposite voltage supply lines, while two interconnected pairs of folded cascode transistors in the gain stage provide a gain stage output. The gain stage transistors are connected to the two pairs of input resistors so that a change in the differential input signal produces a corresponding change in the gain stage output via these resistors. Current sources are provided for each input differential pair, with one current source disabled when the differential input signal approaches one voltage supply, and the other current source disabled when the input signal approaches the other voltage supply.

The gain stage transistors are preferably two pairs of bipolar transistors of opposite conductivity, with the bases of each pair connected together and the collectors of one pair connected to the collectors of the other pair. A current equalization circuit holds the current through the first gain transistor of one pair equal to the current through the first gain transistor of the other pair. The gain transistors are connected to the input resistors so that the currents through the second transistors of each gain pair change in opposite directions in response to a change in the differential input signal; the gain stage output is taken from the collectors of the second gain pair.

An output stage driven by the gain stage includes a pair of output bipolar transistors that are connected so that the current through one output transistor increases and the current through the other output transistor drops in response to a change in the gain stage voltage output. One level shifting resistor is connected between the gain stage output and the base of one of the output transistors, while another level shifting resistor is connected between the gain stage output and a bias inversion circuit that biases the other output transistor to change its current flow in a direction opposite to the first output transistor. The amplifier's ultimate output is taken from the connection between the two output transistors, with the current through each output transistor dynamically changing to contribute to the output current.

These and other features and advantages of the invention will be apparent to those skilled in the art from the following detailed description, taken together with the accompanying drawings.

DETAILED DESCRIPTION OF THE INVENTION

Figure 1:
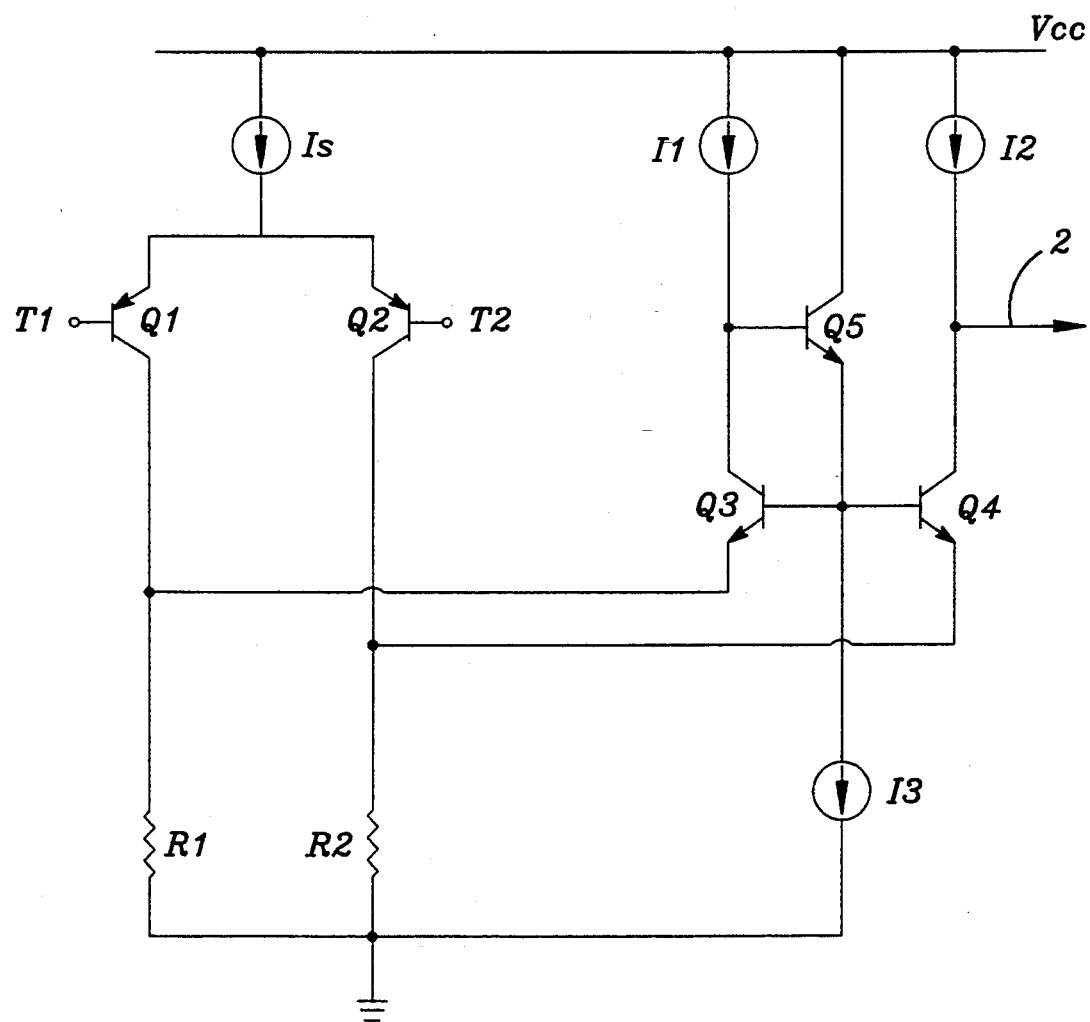
FIG. 1, described above, is a schematic diagram of a prior folded cascode op amp.
Figure 2:
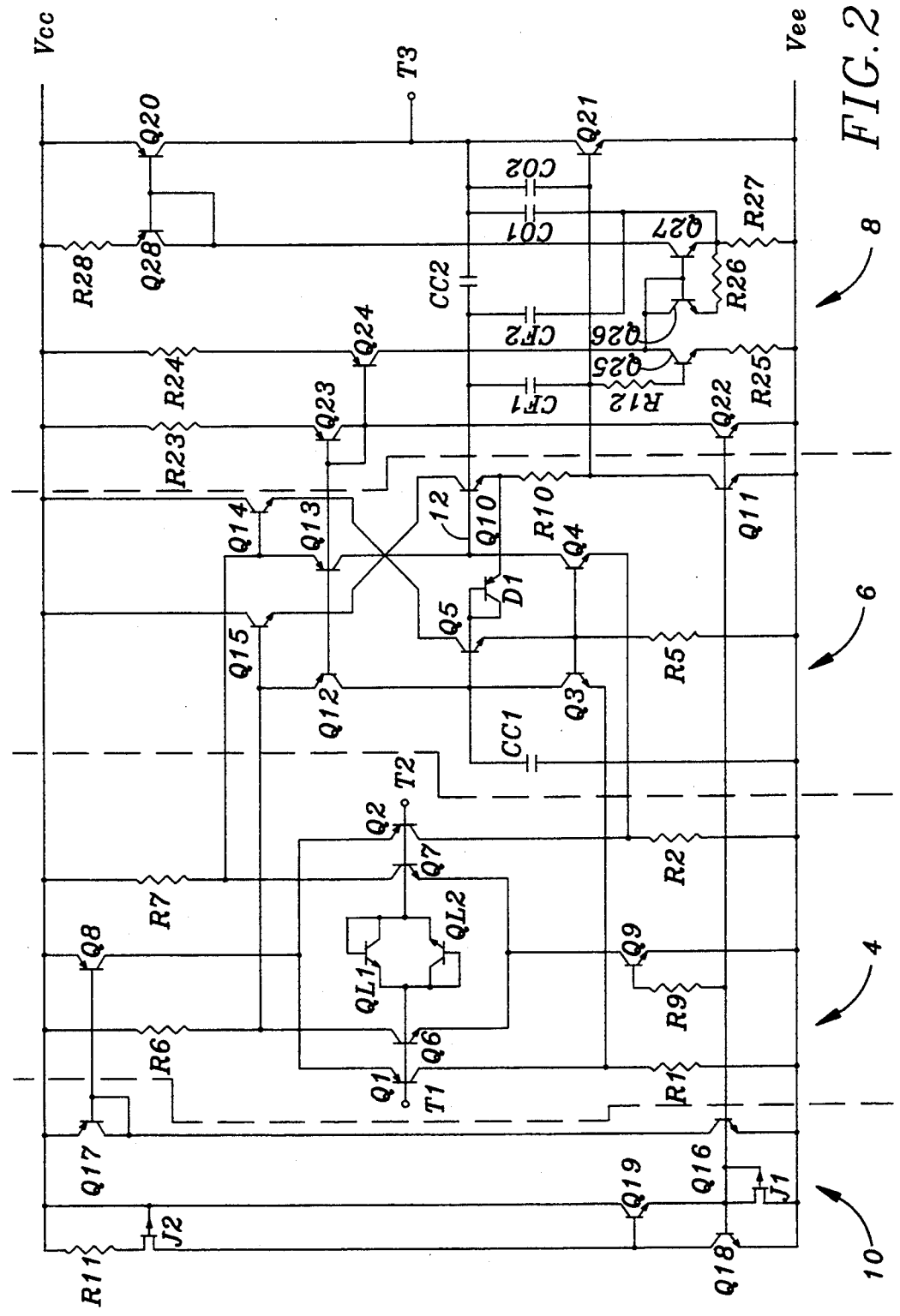
FIG. 2 is a schematic diagram of a double-folded cascode op amp that uses the invention.

FIG. 2 is a schematic diagram of a preferred embodiment of the invention. Certain of its elements also appear in FIG. 1, and are identified by the same reference numerals. The op amp can be conceptually divided into several different stages, as indicated by dashed lines. An input stage 4 receives a differential input voltage signal at input terminals T1 and T2, and provides a corresponding pair of differential signals to a gain stage 6. An output stage 8 receives an amplified signal from the gain stage, and converts it to an output signal at output node or terminal T3. A bias circuit 10 provides current source bias signals for the remainder of the circuitry.

The circuit employs two pairs of input differential transistors Q1, Q2 and Q6, Q7 of opposite conductivity. Q1, Q2 are illustrated as pnp bipolar transistors and Q6, Q7 as npn bipolar transistors, but the input devices could also be implemented with FETs. The input terminal T1 is connected to the bases of Q1 and Q6, while the opposed input terminal T2 is connected to the bases of Q2 and Q7. Voltage limiting transistors QL1 and QL2 are diode-connected to conduct in opposite directions between the bases of Q1, Q6 and the bases of Q2, Q7 to prevent the input differential voltage from exceeding one base-emitter voltage drop (about 0.7 volts) in either direction and thereby protect the input transistors from damage.

Input resistors R1 and R2 are connected respectively from the collectors of Q1 and Q2 to the low voltage supply bus Vee, which can either be ground or a negative voltage. A second pair of input resistors R6 and R7 are connected respectively from the collectors of Q6 and Q7 to the high voltage supply line Vcc. A current source transistor Q8, shown as a pnp bipolar transistor, supplies a current which is divided between Q1 and Q2, while a second current source transistor Q9, shown as an npn bipolar transistor, supplies an equal current for division by Q6 and Q7. Q8 operates off Vcc, while Q9 operates off Vee. The input transistors are matched so that the current division between Q1 and Q2 equals that between Q6 and Q7, with the current through Q1 approximately equalling that through Q7 and the current through Q2 are approximately equalling that through Q6 (except when the common mode input is near Vcc or Vee).

In the gain stage 6, active load npn bipolar transistors Q3 and Q4 have their bases connected together for common biasing and their emitters connected respectively to R1 and R2, as in the prior circuit of FIG. 1. A bias circuit for these transistors consists of (1) the transistor Q5 described previously, with a frequency compensation capacitor CC1 connected between its base and Vee, and (2) a current source resistor R5 that draws current from the common base junction of Q3/Q4 to Vee; a current source resistor is preferably used instead of a transistor to avoid transistor saturation under certain operating conditions. The collector of Q4 is connected to the base of an npn gain transistor Q10, whose emitter is connected through a level shifting resistor R10 to the collector of another npn current source transistor Q11. The emitter of Q10 is limited at about a 1 diode voltage level above the base of Q5 by a diode-connected transistor D1.

A second pair of pnp gain transistors Q12 and Q13 are connected respectively to R6 and R7 in a manner similar to the connections between Q3, Q4 and R1, R2. The current circuits of Q3 and Q12 are in series, with their collectors connected together, as are the current circuits of Q4 and Q13. Q5 operates as an emitter follower, automatically adjusting the base voltage of Q3 so that the current through Q3 remains equal to the current through Q12 despite input signal variations. On the other hand, the currents through Q4 and Q13 are not held equal to each other, and in fact the current differential between these two transistors varies as the input voltage differential at T1-T2 changes. The result is a gain stage output current on line 12, which taps the collector connection of Q4 and Q13. Q3, Q4 on the one hand and Q12, Q13 on the other hand function as two folded cascode circuits, joined together at line 12 and the collector connection of Q3 and Q12.

The collectors of Q5 and Q10 could be connected directly to Vcc. However, they are preferably connected to Vcc through the collector-emitter circuits of npn transistors Q14 and Q15, respectively. The bases of Q14 and Q15 are connected respectively to R7 and R6 to establish a current compensation circuit whose ultimate effect is to supply variations in the base current of gain transistor Q10 when the output load changes, thus relieving the differential voltage signal at input terminals T1, T2 from supplying this incremental base Current. The net result is that relatively large swings in the output current can be accommodated with little change in the input voltage differential. By definition, this translate to a significant increase in the circuit's overall transconductance, with a corresponding increase in its degree of amplification. The manner in which this current compensation is achieved is described in detail in application Ser. No. 08/084,004, filed Jun. 29, 1993 by the present applicant now U.S. Pat. No. 4,323,126 and also assigned to Analog Devices, Inc.

The bias section 10 employs conventional techniques for establishing reference currents that are mirrored by the current sources in the other stages. The base of an npn bias transistor Q16 is referenced to Vee through the base-emitter leads of NPN transistor Q18 to establish a reference current for a diode-connected transistor Q17 that is connected in series with Q16. The base and collector of Q17 are connected to the base of Q8 so that Q8 mirrors the current through Q17. Q18 also sets the base voltage for Q11 and, through a resistor R9, for Q9, the current through Q18 is established by a bias circuit consisting of a resistor R11 that is connected in series with the source-drain circuit of a JFET J2 and the collector-emitter circuit of an npn transistor Q18 between Vcc and Vee, and another npn transistor Q19 that has its base connected to the collector of Q18 and drain of J2, its emitter connected to the base of Q18, and its collector connected in common with the gate of J2 to Vcc.

The operation of the circuit as described thus far can be best understood by describing its response to a change in the differential input signal at terminals T1 and T2. Assume that the voltage at terminal T2 increases relative to the voltage at T1. This produces an increase in the currents through Q1 and Q7 relative to the currents through Q2 and Q6, respectively. The increased current through Q7 increases the voltage drop across R7, and thus reduces both the Q7 collector voltage and the Q13 emitter voltage. This causes a reduction in the Q13 current To the first order, the increase in the Q7 current is approximately equal to the reduction in the Q13 current, The fall in the Q6 current reduces the voltage drop across R6, thus increasing the emitter voltage of Q12 to increase the currents through Q12 and Q3. At the same time, the current through Q1 goes up because of the relative reduction in its base potential. The current increases through Q1 and Q3 both contribute to an increase in the current through R1, which in turn adds to the voltage drop across R1 and raises the emitter and base voltage of Q3 (and thus also the base voltage of Q4) through the emitter follower action of Q3. Raising the base voltage of Q4 increases the current through this transistor. In addition, the reduction in the current through Q2 reduces the voltage drop across R2, thus increasing the base-emitter voltage differential for Q4 to further increase the Q4 current. Thus, to the first order there is a double increase in the current through Q4, resulting from the current increase through Q1 and the current reduction through Q2. There is thus an imbalance between the enlarged Q4 current and the reduced Q13 current. The voltage at the connected collectors of Q4 and Q13 adjusts to reflect this current imbalance, producing a single-ended gain stage voltage output, with a net current flowing on the gain stage output line 12.

If the common mode input voltage falls to Vee input transistors Q6 and Q7 along with their current source Q9 effectively shut down. However, transistors Q1 and Q2 and their current source Q8 are still operational, allowing the amplifier to continue functioning although with a somewhat reduced bandwidth and gain. Conversely, when the common mode input increases to Vcc the input transistors Q1, Q2 and their current source Q8 shut down, while input transistors Q6, Q7 and their current source Q9 continue to operate and keep the amplifier functioning.

The design of the output stage 8 is also unique. The gain stage output line 12 is connected through a frequency compensating capacitor CC2 to the output terminal T3, with the current circuit of a pnp bipolar transistor Q20 connected between Vcc and T3, and the current circuit of an npn bipolar transistor Q21 connected between T3 and Vee. As described below, the currents through Q20 and Q21 change in opposite directions in response to a change in the gain stage output, producing a net output current at terminal T3.

A current source transistor Q22 in the output stage is biased in common with Q11 to produce a reference current for a current mirror that consists of a diode-connected transistor Q23 in series with resistor R23, and a mirroring transistor Q24 in series with resistor R24. To establish the reference current, Q22 is connected in series with Q23 and R23 between Vee and Vcc. The current in this series circuit is mirrored by Q24, which supplies its current to a pair of differentially connected npn transistors Q25 and Q26. The base of Q25 is connected to the gain stage output line 12 through a level shifting resistor R12 and a feedforward capacitor CF1 that allows AC signals to bypass R10, while its collector receives current from Q24 and its emitter is connected to Vee through a resistor R25. The differential transistor Q26 is diode-connected and provides a reference current through a resistor R26 for a mirroring npn transistor Q27, the emitter of which is connected to the opposite side of R26 and through another resistor R27 to Vee. The current through Q27 provides a reference for another current mirror, consisting of diode-connected transistor Q28 and resistor R28 in series between Q27 and Vcc, and the previously mentioned transistor Q20 which is connected to mirror the current through Q28. The transistors Q25–Q28 function as a bias inversion circuit that adjusts the bias for output transistor Q20 so that the current through Q20 changes in a direction opposite to the current change through output transistor Q21 in response to a change in the gain stage output. Remaining elements of the output stage include a second feed-forward capacitor CF2 that allows AC signals on the gain stage output line 12 to bypass transistors Q25 and Q26, an output frequency compensating capacitor CO1 connected between T3 and the emitter of Q27, and another output frequency compensating capacitor CO2 connected between T3 and the base of Q21.

The operation of the output stage will now be explained by describing its response to an increase in the gain stage output voltage on line 12. An increase in the line 12 voltage causes the base voltages of both transistors Q21 and Q25 to go up, which increases the current flows through these npn devices. The increase in current through Q25 draws current from constant current source Q24 away from Q26, causing the current through Q26 and its mirrored current through Q27 to fall. This in turn reduces the currents through Q28 and its mirroring output transistor Q20. The increase in current through Q21 coupled with the reduction in current through Q20 produces a net change in the output current at T3. A similar change in output current accompanies a reduction in the voltage on gain stage output line 12, but in the opposite direction.

The described circuit provides a rail-to-rail input capability as well as a rail-to-rail output range, but with considerably fewer active elements than the previously mentioned double-folded cascode op amp. While a particular embodiment of the invention has been shown and described, numerous variations and alternate embodiments will occur to those skilled in the art.

For example, the circuit could be reconfigured to substitute npn for pnp transistors and vice versa, without significantly effecting its operation. Accordingly, it is intended that the invention be limited only in terms of the appended claims.

I claim:

1. An operational amplifier comprising:
   high and low voltage supply lines,
   an input stage having at least one differential input transistor pair connected to have their currents controlled by a differential input signal, a current source connected to supply a differential current from one of said voltage supply lines to said input transistors, and a pair of input resistors connected between said transistors and the other of said voltage supply lines,
   a cascode gain stage having at least one pair of cascode gain transistors providing a gain stage voltage output and connected to said input transistor pairs so that a change in the differential input signal produces a corresponding change via said input resistors in said gain stage voltage output,
   an output node, and
   an output stage interconnecting said output node with said gain stage output, said output stage including transistor-resistor circuitry producing an output current at said output node that varies in response to changes in the gain stage voltage output, said transistor-resistor circuitry including a pair of output bipolar transistors of opposite conductivities that have their emitters connected to respective ones of said voltage supply lines and their collectors connected together to said output node, and transistor-resistor bias circuitry connected to the bases of said output transistors to bias one of said output transistors to increase its current flow and the other output transistor to reduce its current flow in response to a change in the gain stage voltage output,
   said bias circuitry including a first level shifting resistor connected between the gain stage output and the base of one of said output transistors, a bias inversion circuit connected to supply a bias signal to the base of the other output transistor, and a second level shifting resistor connected between the gain stage output and said bias inversion circuit, said bias inversion circuit biasing said other output transistor to change its current flow in a direction opposite to said one output transistor in response to a change in the level shifted signal it receives from said second level shifting resistor,
   said bias inversion circuit including a pair of differentially connected bias transistors, with one bias transistor receiving a control input from said second level shifting resistor and the other bias transistor providing a current reference for a current mirroring transistor, said current mirroring transistor supplying the current for another transistor that is connected to be current mirrored by said other output transistor.

2. The amplifier of claim 1, wherein said input stage comprises:
   a first differential transistor pair having a first conductivity, control electrodes connected to receive said differential input signal, and respective current circuits,
   a first current source connected to supply a differential current from one of said voltage supply lines to the current circuits of said first differential pair transistors,
   a first pair of input resistors connected between the current circuits of said first differential pair transistors and the other of said voltage supply lines,
   a second differential transistor pair of opposite conductivity to said first differential pair, with control electrodes connected to receive said differential input signal, and respective current circuits,
   a second current source connected to supply a differential current from said other voltage supply lines to the current circuits of said second differential pair transistors, and
   a second pair of input resistors connected between the current circuits of said second differential pair transistors and said one voltage supply line, and
   said gain stage comprises:
      first and second interconnected pairs of folded cascode gain transistors providing said gain stage output and connected to said first and second pairs of input resistors so that a change in the differential input signal produces a corresponding change in said gain stage output via said input resistors.

3. The amplifier of claim 2, wherein said first current source is disabled but said second current source remains enabled when said differential input signal approaches said one voltage supply, and said second current source is disabled but said first current source remains enabled when said differential input signal approaches said other voltage supply, thereby providing a rail-to-rail input stage.

4. The amplifier of claim 2, wherein said first pair of gain transistors comprises first and second bipolar transistors of the same conductivity and having their bases connected together, said second pair of gain transistors comprises third and fourth bipolar transistors of opposite conductivity to said first pair of gain transistors of opposite conductivity to said first pair of gain transistors and having their bases connected together, the collectors of said first and third gain transistors are connected together, the collectors of said second and fourth gain transistors are connected together, and said gain stage output is taken from the collectors of said second and fourth gain transistors.

5. The amplifier of claim 4, wherein the currents through said first pair of input transistors control the current through said second gain transistor, and the currents through said second pair of input transistors control the current through said fourth gain transistor, with said second and fourth gain transistors connected to respective resistors of said first and second pairs of input resistors so that the currents through said second and fourth gain transistors change in opposite directions in response to a change in the differential input signal.

6. The amplifier of claim 5, further comprising a current equalization circuit connected to maintain substantially equal current flows through said first and third gain transistors over a range of differential input signals.

7. The amplifier of claim 6, said current equalization circuit comprising a bipolar transistor having its base connected to the collector of said first gain transistor circuit, its emitter connected to the base of said first gain transistor and its collector connected in circuit with said one voltage supply line.

8. The amplifier of claim 6, wherein said first differential transistor pair comprises first and second input transistors connected respectively to first and second resistors of said first pair of input resistors, said second differential transistor pair comprises third and fourth input transistors connected respectively to third and fourth resistors of said second pair of input resistors, and the emitters of said first, second, third and fourth gain transistors are connected respectively to said first, second, third and fourth resistors.

* * * * *